(12) United States Patent
Yoneyama et al.

(10) Patent No.: US 9,929,201 B2
(45) Date of Patent: Mar. 27, 2018

(54) IMAGE PICKUP APPARATUS AND IMAGE PICKUP APPARATUS MANUFACTURING METHOD

(71) Applicant: OLYMPUS CORPORATION, Tokyo (JP)

(72) Inventors: Jumpei Yoneyama, Nagano (JP); Takahiro Shimohata, Nagano (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/241,377

(22) Filed: Aug. 19, 2016

(65) Prior Publication Data

US 2016/0358964 A1 Dec. 8, 2016

Related U.S. Application Data

(63) Continuation of application No. PCT/JP2015/054294, filed on Feb. 17, 2015.

(30) Foreign Application Priority Data

Feb. 24, 2014 (JP) .................. 2014-033081
Feb. 24, 2014 (JP) .................. 2014-033083

(51) Int. Cl.
*H01L 27/146* (2006.01)
*H01L 31/02* (2006.01)
(Continued)

(52) U.S. Cl.
CPC .. *H01L 27/14632* (2013.01); *H01L 27/14618* (2013.01); *H01L 27/14636* (2013.01);
(Continued)

(58) Field of Classification Search
CPC ......... H01L 27/14632; H01L 27/14618; H01L 27/14636; H01L 27/14687;
(Continued)

(56) References Cited

U.S. PATENT DOCUMENTS

2002/0038851 A1* 4/2002 Kajiwara ............. A61B 6/4216
250/368

FOREIGN PATENT DOCUMENTS

JP 02140935 A * 5/1990
JP H02-140935 A 5/1990
(Continued)

OTHER PUBLICATIONS

International Search Report dated Apr. 28, 2015 issued in PCT/JP2015/054294.

*Primary Examiner* — Cuong Q Nguyen
*Assistant Examiner* — Tong-Ho Kim
(74) *Attorney, Agent, or Firm* — Scully, Scott, Murphy & Presser, P.C.

(57) ABSTRACT

An image pickup apparatus is configured with an image pickup device on which a plurality of bumps are arranged in line on an outer circumferential portion of a light receiving surface; and a flexible wiring board including a plurality of inner leads each of which is configured with a distal end portion, a bending portion and a rear end portion, the distal end portion being compression-bonded to a bump, and the rear end portion being arranged parallel to a side face of the image pickup device with the bending portion interposed between the distal end portion and the rear end portion. A height of a light receiving portion side of the bumps is lower than a height of a side face side; and each of the inner leads is plastically transformed according to a shape of a top face of the bumps.

15 Claims, 13 Drawing Sheets

(51) Int. Cl.
*H04N 5/335* (2011.01)
*H05K 1/11* (2006.01)
*H04N 5/225* (2006.01)
*H05K 1/02* (2006.01)
*H01L 31/0203* (2014.01)

(52) U.S. Cl.
CPC .. *H01L 27/14687* (2013.01); *H01L 31/02005* (2013.01); *H04N 5/2253* (2013.01); *H04N 5/335* (2013.01); *H05K 1/118* (2013.01); *H01L 31/0203* (2013.01); *H01L 2924/0002* (2013.01); *H05K 1/028* (2013.01); *H05K 2201/0373* (2013.01); *H05K 2201/0382* (2013.01); *H05K 2201/0397* (2013.01); *H05K 2201/09154* (2013.01); *H05K 2201/09445* (2013.01); *H05K 2201/09845* (2013.01); *H05K 2203/0228* (2013.01); *H05K 2203/0285* (2013.01); *H05K 2203/049* (2013.01)

(58) Field of Classification Search
CPC ........... H01L 31/02005; H01L 31/0203; H01L 2924/0002; H04N 5/2253; H04N 5/335; H05K 1/118; H05K 1/028; H05K 2201/0373; H05K 2201/0382; H05K 2201/0397; H05K 2201/09154; H05K 2201/09445; H05K 2201/09845; H05K 2203/0228; H05K 2203/0285; H05K 2203/049
USPC .................................................. 257/433, 368
See application file for complete search history.

(56) References Cited

FOREIGN PATENT DOCUMENTS

| | | | |
|---|---|---|---|
| JP | H05-115435 A | | 5/1993 |
| JP | 07240441 A | * | 9/1995 |
| JP | H07-240441 A | | 9/1995 |
| JP | H08-148666 A | | 6/1996 |
| JP | 2001-345438 A | | 12/2001 |

* cited by examiner

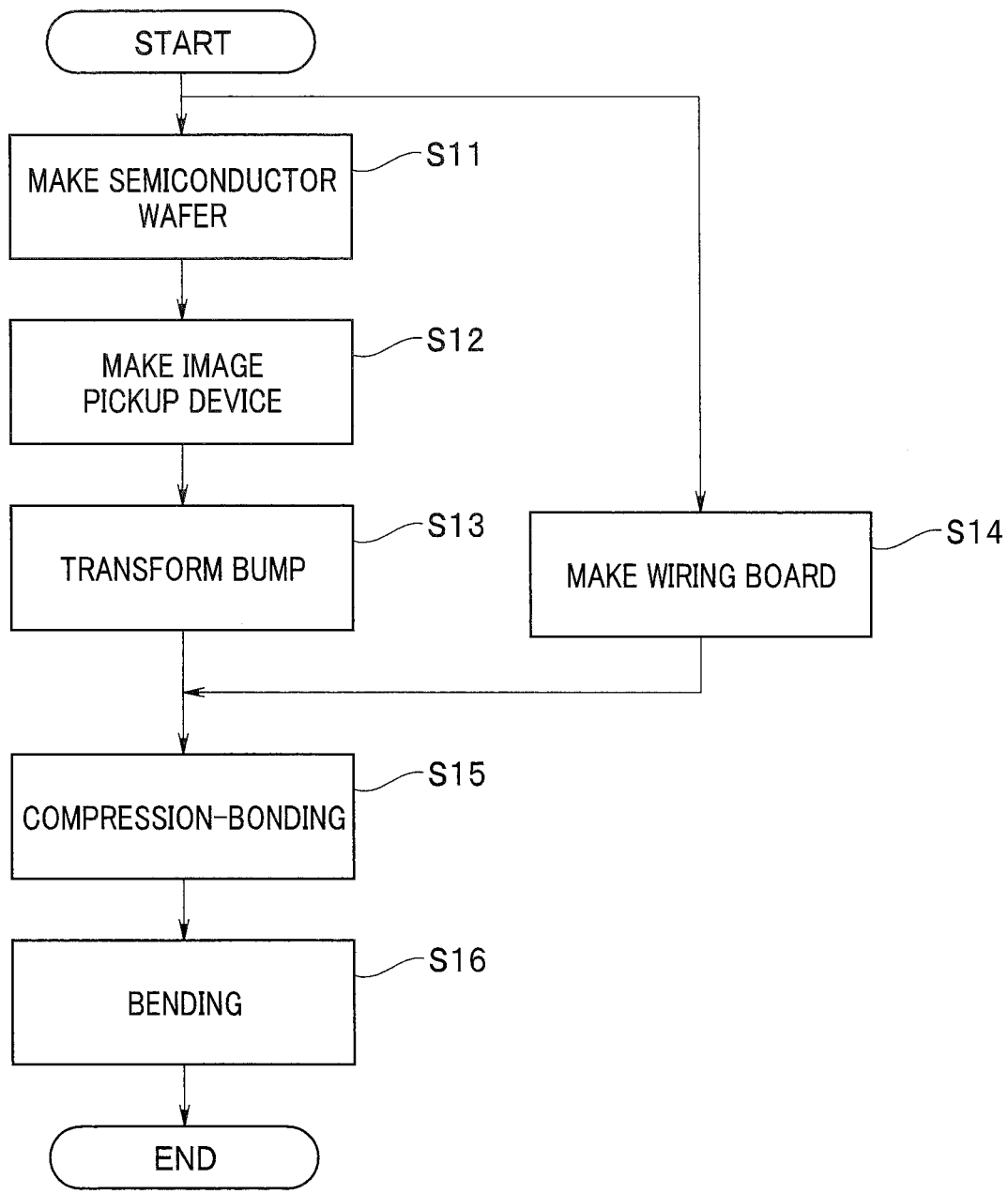

IMAGE PICKUP APPARATUS AND IMAGE PICKUP APPARATUS MANUFACTURING METHOD

CROSS REFERENCE TO RELATED APPLICATIONS

This application is a continuation application of PCT/JP2015/054294 filed on Feb. 17, 2015 and claims benefit of Japanese Applications No. 2014-033081 filed in Japan on Feb. 24, 2014, and No. 2014-033083 filed in Japan on Feb. 24, 2014, the entire contents of each of which are incorporated herein by their reference.

BACKGROUND OF INVENTION

1. Field of the Invention

The present invention relates to an image pickup apparatus provided with an image pickup device on which a plurality of bumps connected to a light receiving portion are arranged in line on an outer circumferential portion of a light receiving surface on which the light receiving portion is formed, and a flexible wiring board including a plurality of inner leads each of which is connected to any of the plurality of bumps; and a method for manufacturing the image pickup apparatus.

2. Description of the Related Art

A solid-state image pickup apparatus 101 shown in FIG. 1 is disclosed in Japanese Patent Application Laid-Open Publication No. H5-115435. The solid-state image pickup apparatus 101 is provided with a solid-state image pickup device 110 on which a light receiving portion is formed and a substrate 120. An inner lead 121 of the substrate 120 is connected to a metal projection 114, which is a bump of the solid-state image pickup device 110 for external connection.

Since the inner lead 121 is bent substantially at a right angle in a direction opposite to a light receiving surface 110SA, the solid-state image pickup device 110 has a small diameter. In order to prevent the inner lead 121 from coming into contact with and short-circuited with the solid-state image pickup device 110, an insulating plate 150 is arranged on a side face of the solid-state image pickup device 110.

SUMMARY OF THE INVENTION

An image pickup apparatus of an embodiment of the present invention includes: an image pickup device on which a plurality of bumps connected to a light receiving portion are arranged in line on an outer circumferential portion of a light receiving surface on which the light receiving portion is formed; and a flexible wiring board including a plurality of inner leads each of which is configured with a distal end portion, a bending portion and a rear end portion, the distal end portion being compression-bonded to any one of the plurality of bumps, and the rear end portion being arranged parallel to a side face of the image pickup device with the bending portion interposed between the distal end portion and the rear end portion; a height of a light receiving portion side of the bumps is lower than a height of a side face side; and the bending portion of each of the inner leads is plastically transformed according to a shape of top faces of the bumps.

An image pickup apparatus manufacturing method of another embodiment includes the steps of: an image pickup device on which a plurality of bumps connected to a light receiving portion are arranged in line on an outer circumferential portion of a light receiving surface on which the light receiving portion is formed being made; pressure being applied to a light receiving portion side of the plurality of bumps so that the bumps are plastically transformed in a manner that a height of the light receiving portion side is lower than a height of a side face side; a flexible wiring board including a plurality of inner leads being made; the inner leads being compression-bonded to the bumps while being plastically transformed according to a shape of a top face of the bumps, by applying pressure to a distal end portion of each of the inner leads arranged on the light receiving portion side of the bumps; and the inner leads being bent so that rear end portions are arranged parallel to a side face of the image pickup device.

An image pickup apparatus manufacturing method of still another embodiment includes the steps of: an image pickup device on which a plurality of bumps connected to a light receiving portion are arranged in line on an outer circumferential portion of a light receiving surface on which the light receiving portion is formed being made; a flexible wiring board including a plurality of inner leads being made; the inner leads and the bumps being compression-bonded while being transformed, by pressure being applied to a distal end portion arranged on a light receiving portion side of the bumps; and the inner leads being bent so that rear end portions are arranged parallel to a side face of the image pickup device.

BRIEF DESCRIPTION OF THE DRAWINGS

FIG. 6 is a flowchart of a method for manufacturing the image pickup apparatus of the first embodiment of the present invention;

DETAILED DESCRIPTION OF THE PREFERRED EMBODIMENT(S)

First Embodiment

Figure 1:
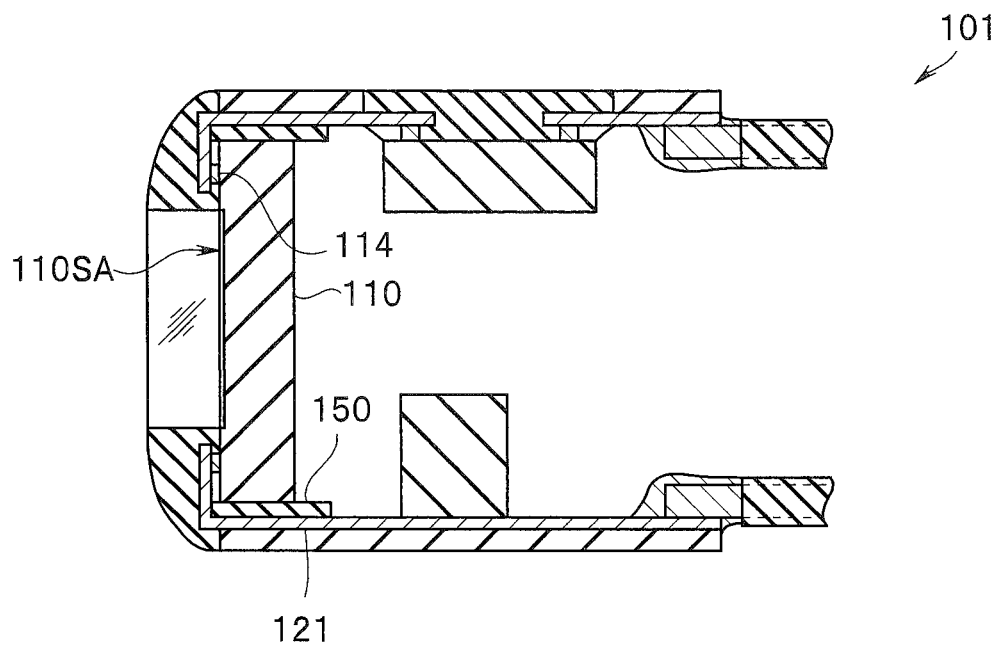
FIG. 1 is a cross-sectional view of a prior-art image pickup apparatus.
Figure 2:
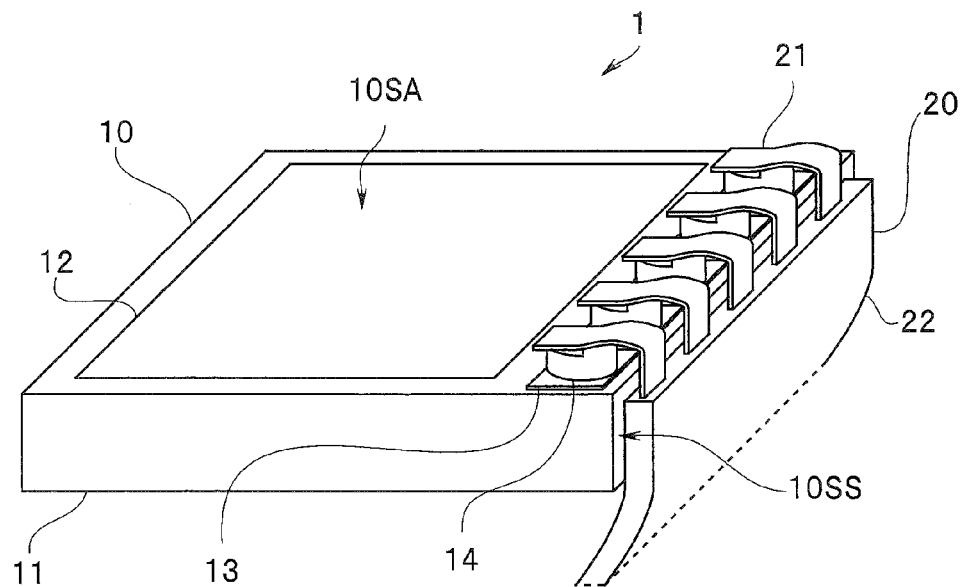
FIG. 2 is a perspective view of an image pickup apparatus of a first embodiment of the present invention.
Figure 3:
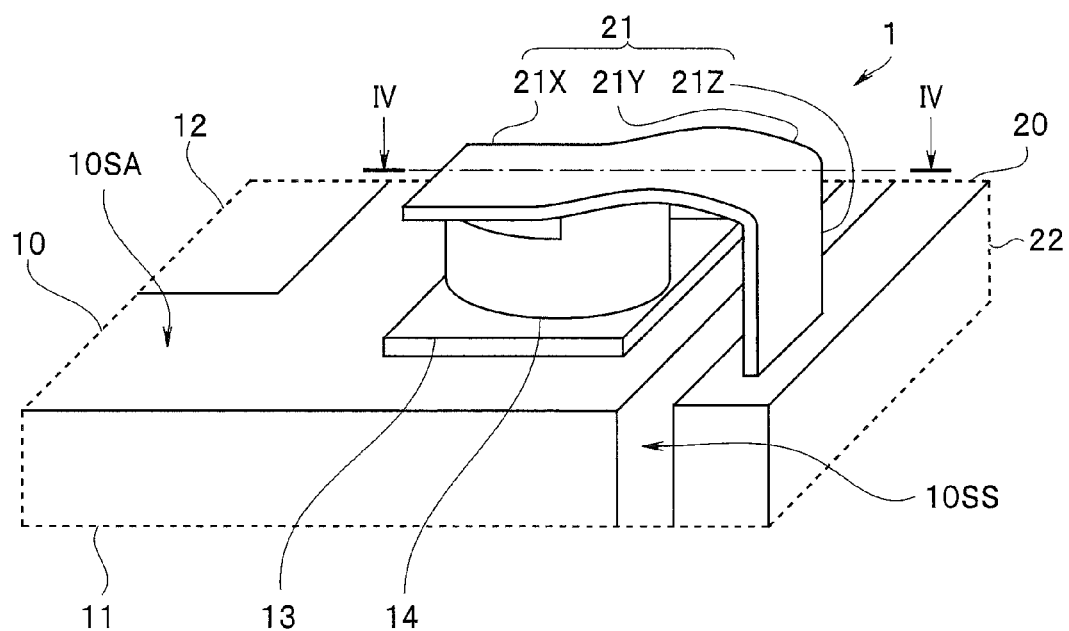
FIG. 3 is a perspective view of a bonded portion of the image pickup apparatus of the first embodiment of the present invention.
Figure 4:
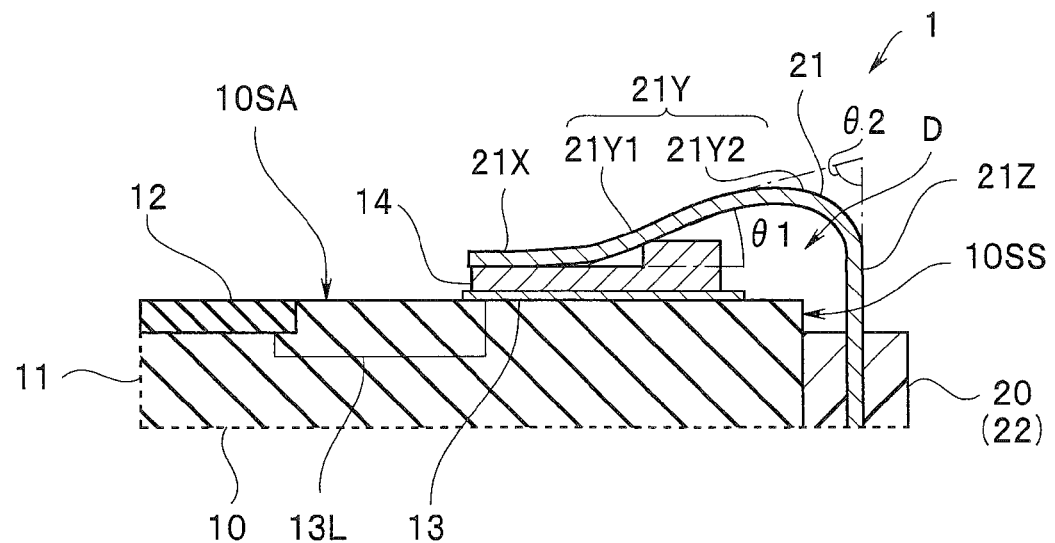
FIG. 4 is a cross-sectional view of the bonded portion of the image pickup apparatus of the first embodiment of the present invention, along a IV-IV line in FIG. 3.

An image pickup apparatus 1 of the present invention is provided with an image pickup device 10 and a flexible wiring board 20 as shown in FIGS. 2 to 4.

The image pickup device 10 is a substantially rectangular parallelepiped chip made of semiconductor material such as silicon. As described later, the image pickup device 10 is made by cutting and dividing a semiconductor wafer on which a plurality of image pickup devices are formed, by a well-known semiconductor process. The image pickup device 10 has a light receiving surface 10SA, for example, with a size between 500 µm×500 µm and 1000 µm×1000 µm, including 500 µm×500 µm and 1000 µm×1000 µm, and a thickness between 100 µm and 300 µm, including 100 µm and 300 µm. That is, the image pickup device 10 of the image pickup apparatus 1, for example, arranged at a distal end portion of an endoscope is microminiature.

On an outer circumferential portion of the light receiving surface 10SA of a semiconductor chip 11 on which a light receiving portion 12 is formed, a plurality of electrode pads 13 each of which is connected to the light receiving portion 12 are arranged in line along an edge side. Bumps 14 are arranged on the electrode pads 13. Though the light receiving portion 12 and the electrode pads 13 are electrically connected via internal wiring 13L, the light receiving portion 12 and the electrode pads 13 may be connected via surface wiring simultaneously when the electrode pads 13 are formed. Note that, in drawings described below, the internal wiring 13L and the electrode pads 13 may be omitted and not shown.

The light receiving portion 12 is configured with a photoelectric conversion element such as a CCD or CMOS image pickup body. The bump 14 is a protrusion-shaped metal formed on the electrode pad 13 with a thickness between 1 µm and 10 µm, including 1 µm and 10 µm, and is, for example, a gold bump made of gold. In order to guarantee favorable bond strength, it is desirable that a height and diameter of the bump 14 are between 10 µm and 100 µm, including 10 µm and 100 µm, and between 30 µm and 100 µm, including 30 µm and 100 µm, respectively.

The wiring board 20 is a flexible wiring board for which flexible resin such as polyimide is used as base material 22 and which has a plurality of wirings 21L made of copper or the like. Note that, though the wirings 21L are arranged in the base material 22, the wirings 21L may be arranged on a surface. Further, the wiring board 20 may be a multilayer wiring board, may be implemented with electronic components such as a chip capacitor on the surface, or may include the electronic components.

The wirings 21L project from the base material 22 at an end face of the wiring board 20 and constitute inner leads 21. The inner lead 21 may be referred to as a flying lead. For example, the inner lead 21 (the wiring 21L) with a thickness between 20 µm and 50 µm, including 20 µm and 50 µm, and a length between 50 µm and 500 µm, including 50 µm and 500 µm, has flexibility and is plastically deformed by external stress. Note that it is desirable that the length of the inner lead 21 does not exceed the thickness of the image pickup device 10 plus 100 µm. For example, when the thickness of the image pickup device is between 100 µm and 300 µm, including 100 µm and 300 µm, it is desirable that the length of the inner lead 21 is between 200 µm and 400 µm, including 200 µm and 400 µm.

As shown in FIG. 3, the inner lead 21 is configured with a distal end portion 21X, a bending portion 21Y and a rear end portion 21Z. That is, a part of the inner lead 21 which is compression-bonded to the bump 14 of the inner lead 21 is referred to as the distal end portion 21X; a bent part extending from the distal end portion 21X is referred to as the bending portion 21Y; and a part extending from the bending portion 21Y and arranged parallel to a side face 10SS of the image pickup device 10 is referred to as the rear end portion 21Z. However, though the distal end portion 21X, the bending portion 21Y and the rear end portion 21Z are separated for explanation, they are integrated, and boundaries among them are not clear.

As described above, the bending portion 21Y is constituted with a first bending portion 21Y1 bent in an upward direction so as to be away from the light receiving surface 10SA of the image pickup device 10, with a bonded portion between the distal end portion 21X and the bump 14 as a starting point, and a second bending portion 21Y2 bent so that the rear end portion 21Z is parallel to the side face 10SS of the image pickup device 10. The first bending portion 21Y1 and the second bending portion 21Y2 are recess-shaped and protrusion-shaped relative to the light receiving surface 10SA, respectively. Note that, when a bending angle of the first bending portion 21Y1 is assumed to be θ1 degrees, a bending angle θ2 of the second bending portion 21Y2 is about (90−θ1) degrees.

Figure 5:
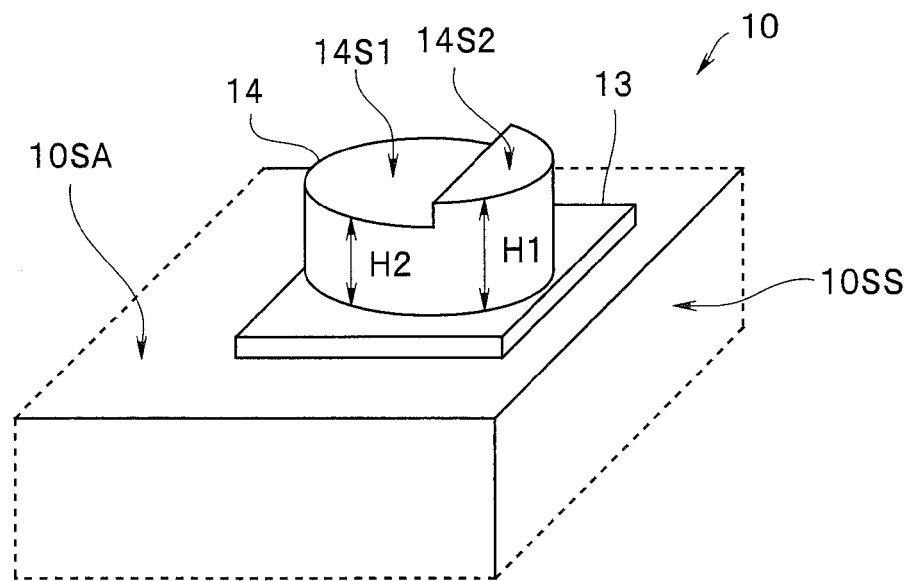
FIG. 5 is a perspective view of a bump of the image pickup apparatus of the first embodiment of the present invention.

As shown in FIG. 5, there is a step on a top face of the bump 14 before being bonded to the inner lead 21, and a height H2 of a light receiving portion side 14S1 is lower than a height H1 of a side face side 14S2. In other words, the bump 14 has a height difference.

Because of the shape (the height difference) of the top face of the bump 14, the rear end portion side 21Y2 of the bending portion 21Y of the inner lead 21 is protrusion-shaped relative to the light receiving surface 10SA while the distal end side 21Y1 is recess-shaped. In other words, the inner lead 21 is plastically deformed in a direction more away from the light receiving surface 10SA on the distal end side 21Y1.

Therefore, in the image pickup apparatus 1, the inner lead 21 bent substantially at a right angle does not happen to come into contact with a corner portion of the image pickup device 10 and the side face 10SS.

As described above, the image pickup apparatus is an image pickup apparatus provided with an image pickup device on which a plurality of electrode pads connected to a light receiving portion are arranged in line on an outer circumferential portion of a light receiving surface on which the light receiving portion is formed, and a flexible wiring board including a plurality of inner leads each of which is connected to any of the plurality of electrode pads; and each of the plurality of inner leads is configured with a distal end portion, a bending portion and a rear end portion, the distal end portion being connected to the electrode pad, the bending portion being configured with a first bending portion and a second bending portion which are recess-shaped and projection-shaped, respectively, relative to the light receiving surface, and the rear end portion being arranged parallel to a side face of the image pickup device.

Since the inner leads 21 are bent at substantially at a right angle and extended to an opposite side of the light receiving surface 10SA substantially parallel to the side face 10SS of the image pickup device 10, a diameter of the image pickup apparatus 1 is small. Therefore, an endoscope with the image pickup apparatus 1 arranged at the distal end portion of an insertion portion has a small diameter and is minimally invasive.

Note that, in the image pickup apparatus 1, one wiring board 20 is bonded to the image pickup device 10 as shown in FIG. 2. That is, the plurality of bumps 14 are arranged in line along one edge side. However, a plurality of wiring boards 20 may be bonded to the image pickup device 10. For example, it is also conceivable that a plurality of bumps 14 are arranged in two lines along two edge sides facing each other, and two wiring boards are bonded to the image pickup device.

Further, the light receiving portion 12 of the image pickup device 10 may be covered with cover glass, and the electrode pads 13, the bumps 14 and the inner lead 21 may be covered with sealing resin.

<Method for Manufacturing Image Pickup Apparatus>

Next, a method for manufacturing the image pickup apparatus 1 will be described along a flowchart of FIG. 6.

<Step S11>

A semiconductor wafer (not shown) is made which has a plurality of light receiving portions, and a plurality of bumps arranged around each light receiving portion and connected to the light receiving portion, on a light receiving surface.

The bumps 14 are, for example, stud bumps or plated bumps. The stud bumps are made by metal-bonding gold balls formed by discharge-melting distal ends of gold wires to the electrode pads 13 using a wire bonding apparatus and then cutting the wires. The plated bumps are made by an electroplating method.

Note that, when the bumps 14 are stud bumps, the bumps 14 are press-processed by a jig so that the top faces become substantially flat. That is, the bumps 14 made of relatively soft metal, for example, gold are plastically deformed by external force easily.

<Step S12>

The semiconductor wafer is cut to make the semiconductor chip 11 configured with a rectangular parallelepiped semiconductor. The semiconductor chip 11 is the image pickup device 10 on which the plurality of bumps 14 connected to the light receiving portion 12 are arranged in line on the outer circumferential portion of the light receiving surface 10SA on which the light receiving portion 12 is formed.

Note that, in the case where the bumps 14 are stud bumps or the like, the bumps 14 may be arranged after cutting the semiconductor wafer.

<Step S13>

Figure 7A:
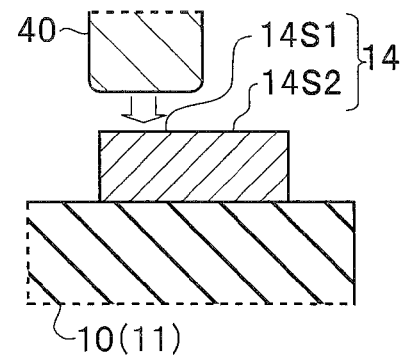
FIG. 7A is a cross-sectional view for illustrating a method for manufacturing the bump of the image pickup apparatus of the first embodiment of the present invention.
Figure 7B:
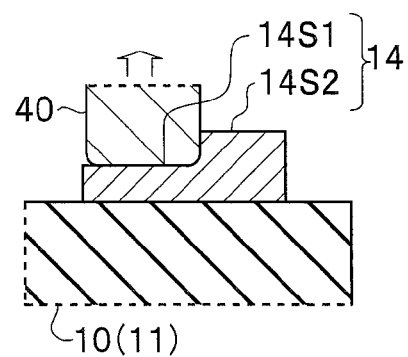
FIG. 7B is a cross-sectional view for illustrating the method for manufacturing the bump of the image pickup apparatus of the first embodiment of the present invention.
Figure 7C:
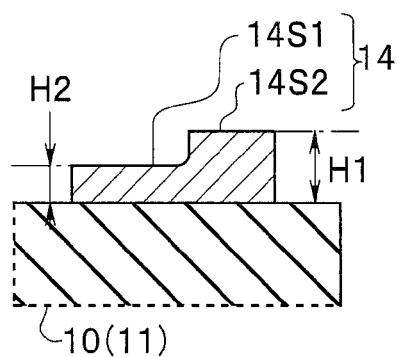
FIG. 7C is a cross-sectional view for illustrating the method for manufacturing the bump of the image pickup apparatus of the first embodiment of the present invention.

As shown in FIGS. 7A and 7B, a compression-bonding jig 40 for compression-bonding is pressed on the light receiving portion side 14S1 on the top face of the bump 14. Then, as shown in FIG. 7C, the bump 14 is plastically deformed so that the height H2 of the light receiving portion side 14S1 is lower than the height H1 of the side face side 14S2.

It is favorable that the compression-bonding jig 40 is in a bar shape by which the plurality of bumps 14 arranged in line are simultaneously pressed. Furthermore, by using a heat bar as the compression-bonding jig 40 to heat the bumps 14 at the time of pressing the bumps 14, the bumps 14 can be plastically deformed at a lower temperature. Note that heating temperature is, for example, between 100° C. and 400° C., including 100° C. and 400° C., and below a melting point of material of the bumps 14, the bumps 14 do not happen to melt. Instead of heat or in addition to heat, ultrasound may be applied to the compression-bonding jig 40.

<Step S14>

The wiring board 20 under predetermined specifications is made. The plurality of inner leads 21 project from the end face of the wiring board 20. An arrangement interval (pitch) among the plurality of inner leads 21 is same as an arrangement interval (pitch) among the bumps 14 of the image pickup device 10. The wiring board 20 may be made prior to the process of steps S11 to S14.

<Step S15>

Figure 8A:
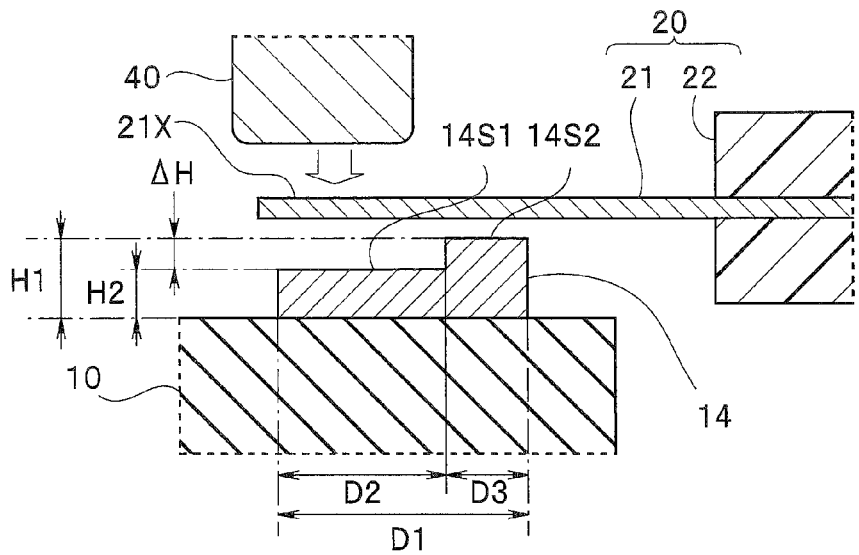
FIG. 8A is a cross-sectional view for illustrating the method for manufacturing the image pickup apparatus of the first embodiment of the present invention.

As shown in FIG. 8A, the distal end portion 21X of the inner lead 21 is aligned immediately above the light receiving portion side 14S1 of the bump 14.

Note that the height H1 of the bump 14, the height H2 of the light receiving portion side 14S1, a width D1 of the bump 14, a width D2 of the light receiving portion side 14S1, and a width D3 of the side face side 14S2 are appropriately determined according to specifications of the image pickup apparatus 1.

For example, the height H1 of the bump 14 is between 10 µm and 100 µm, including 10 µm and 100 µm, and the height H2 of the light receiving portion side 14S1 is between 90% and 10% of the height H1, including 90% and 10%. That is, a step ΔT on the top face of the bump 14 is between 1 µm and 90 µm, including 1 µm and 90 µm. Further, for example, the width D1 of the bump 14 is between 10 µm and 100 µm, including 10 µm and 100 µm, and the width D2 of the light receiving portion side 14S1 is between 90% and 10% of the width D1, including 90% and 10%. A bending shape of the bending portion 21Y of the inner lead 21 is determined according to the shape of the top face of the bump 14.

If the values are within the above ranges, the inner lead 21 and the image pickup device 10 do not easily come into contact with each other even if the inner lead 21 is folded substantially at a right angle as described below.

Figure 8B:
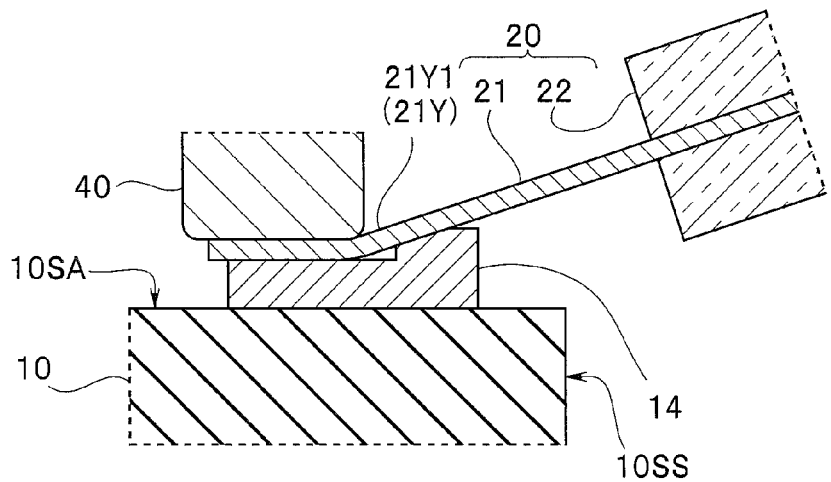
FIG. 8B is a cross-sectional view for illustrating the method for manufacturing the image pickup apparatus of the first embodiment of the present invention.

As shown in FIG. 8B, the distal end portion of the inner lead 21 and the light receiving portion side 14S1 of the bump 14 are compression-bonded by the compression-bonding jig 40. At this time, the inner lead 21 abuts against the side face sides 14S2 (a part having the height H1) of the bump 14 and is, therefore, plastically deformed in a recess shape relative to the light receiving surface 10SA, with a bonding end face as a starting point.

The distal end portion 21X of the inner lead 21 is compression-bonded to the bump 14 while the distal end side 21Y1 of the bending portion 21Y is being plastically deformed according to the shape of the top face of the bump 14. Note that, though interfaces of the side face side 14S2 of the bump 14 which is not pressed by the compression-bonding jig 40 and the inner lead 21 are in contact with each other, they are not so strongly bonded to each other as compression-bonded interfaces of the light receiving portion side 14S1 of the bump 14 and the inner lead 21.

Note that a same compression-bonding jig can be used for the plastic deformation process and the compression-bonding process for bumps. Furthermore, the same compression-bonding jig may be used for a flattening process for top faces of stud bumps. For example, it is possible to, by using a same compression-bonding apparatus and a same compression-bonding jig, perform the flattening process for the top faces of the stud bumps first, and then bond the inner leads 21 after performing the plastic deformation process for the bumps. Note that it is preferable to use a bar-shaped compression-bonding jig capable of simultaneously pressing a plurality of bumps and a plurality of inner leads.

<Step S16>

Figure 8C:
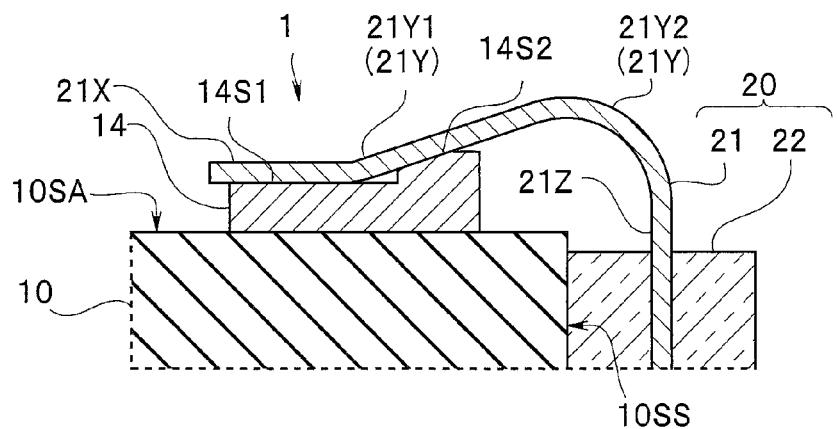
FIG. 8C is a cross-sectional view for illustrating the method for manufacturing the image pickup apparatus of the first embodiment of the present invention.

As shown in FIG. 8C, the inner lead 21 is bent so that the rear end portion 21Z is arranged substantially parallel to the side face 10SS of the image pickup device 10. That is, a rear end side of the distal end side 21Y1 of the bending portion 21Y of the inner lead 21, which is plastically transformed into a recess shape, becomes the rear end portion side 21Y2 of the bending portion 21Y which is plastically transformed into a projection shape.

Note that bending may be performed in a state that a bar-shaped bending jig (not shown) is inserted between the plurality of inner leads 21 and the image pickup device 10.

Further, the inner lead 21 may be bent substantially at a right angle while being compression-bonded by the compression-bonding jig 40 in a state that the image pickup device 10 is set on the compression-bonding apparatus. As already described, the flattening process for top faces of stud bumps, the plastic transformation process and the compression-bonding process can be performed with the same compression-bonding apparatus. Therefore, processes up to the bending process may be performed by one compression-bonding apparatus.

Note that a bonded portion may be sealed with sealing resin after being bonded. Furthermore, the base material 22 of the flexible wiring board 20 may be bonded to the side face 10SS of the image pickup device 10 via adhesive or the like. Further, when the rear end portion 21Z of the inner lead 21 is long, the rear end portion 21Z may be sealed with resin so as to cover the side face MS.

According to the method for manufacturing the image pickup device 10, since a distance between the inner lead 21 and the light receiving surface 10SA of the image pickup device 10 is lengthened by the distal end side 21Y1 plastically deformed in a recess shape before the inner lead 21 is bent approximately parallel to the side face 10SS of the image pickup device 10, it is easy to bend the inner lead 21 substantially at a right angle in a manner that the inner lead 21 does not come into contact with the image pickup device 10.

<Modification of the First Embodiment>

The method for manufacturing the bump 14 having a step on the top face is not limited to the method of performing partial plastic deformation by the compression-bonding jig 40 for compression-bonding.

Figure 9A:
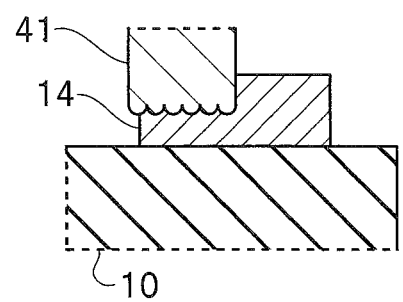
FIG. 9A is a cross-sectional view for illustrating a method for manufacturing the bump of the image pickup apparatus, of a modification of the first embodiment of the present invention.
Figure 9B:
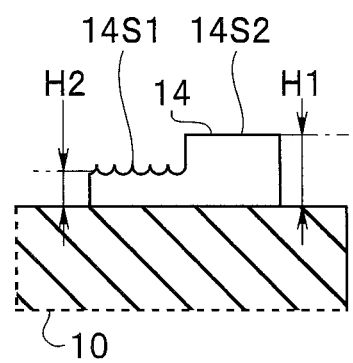
FIG. 9B is a cross-sectional view for illustrating the method for manufacturing the bump of the image pickup apparatus, of the modification of the first embodiment of the present invention.

For example, as shown in FIGS. 9A and 9B, a part of the bump 14 may be cut by a cutting jig 41.

Figure 10A:
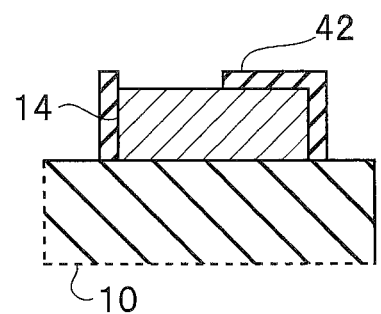
FIG. 10A is a cross-sectional view for illustrating a method for manufacturing the bump of the image pickup apparatus, of a modification of the first embodiment of the present invention.
Figure 10B:
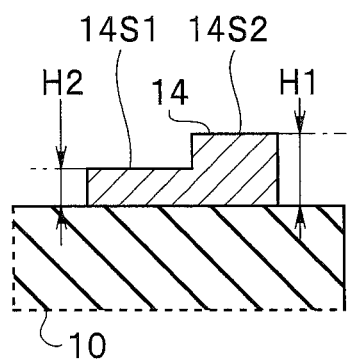
FIG. 10B is a cross-sectional view for illustrating the method for manufacturing the bump of the image pickup apparatus, of the modification of the first embodiment of the present invention.
Figure 10C:
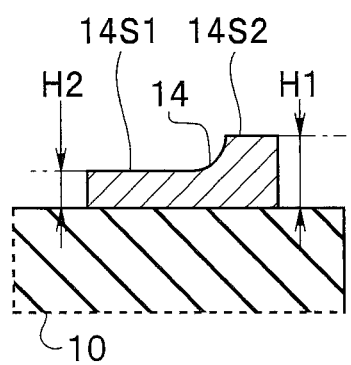
FIG. 10C is a cross-sectional view for illustrating the method for manufacturing the bump of the image pickup apparatus, of the modification of the first embodiment of the present invention.

Further, it is also possible to, after covering the bump 14 with an etching mask 42 as shown in FIG. 10A, perform an anisotropic etching process by a dry etching method as shown in FIG. 10B or perform an isotropic etching process by a wet etching method as shown in FIG. 10C.

Figure 11A:
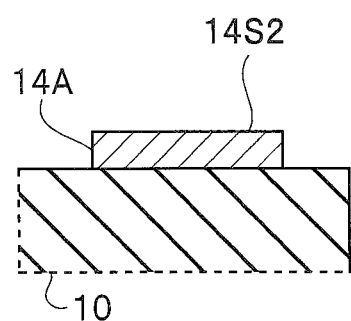
FIG. 11A is a cross-sectional view for illustrating a method for manufacturing the bump of the image pickup apparatus, of a modification of the first embodiment of the present invention.
Figure 11B:
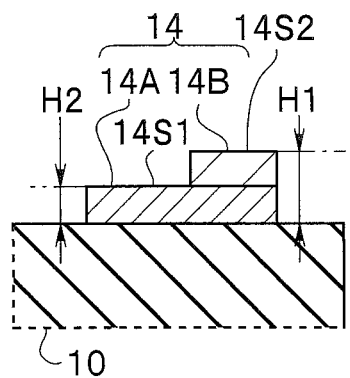
FIG. 11B is a cross-sectional view for illustrating the method for manufacturing the bump of the image pickup apparatus, of the modification of the first embodiment of the present invention.
Figure 12:
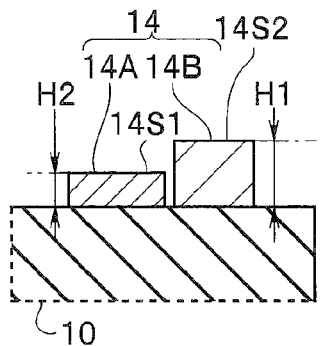
FIG. 12 is a cross-sectional view for illustrating the bump of the image pickup apparatus, of a modification of the first embodiment of the present invention.

Furthermore, as shown in FIGS. 11A and 11B, a bump 14B may be further arranged on the side face side 14S2 of the top face of a bump 14A. Further, the bump 14 shown in FIG. 12 is constituted by a plurality of members 14A and 14B with different heights.

Further, if there is a height difference on the top face, the bump 14 may be inclined relative to the light receiving surface 10SA or may have a slope surface and a surface having a step.

The image pickup apparatus of the modification is different from the image pickup apparatus 1 of the embodiment in the shape of the bump 14. However, since the height H2 of the light receiving portion side 14S1 of the bump 14 is lower than the height H1 of the side face side 14S2 in both shapes, a same advantageous effect as that of the image pickup apparatus 1 is obtained.

Second Embodiment

An image pickup apparatus 1A of a second embodiment and a method for manufacturing the image pickup apparatus 1A will be described. Since the image pickup apparatus 1A and the method for manufacturing the image pickup apparatus 1A are similar to the image pickup apparatus 1 and the method for manufacturing the image pickup apparatus 1, same reference numerals will be given to components having same functions, and description of the component will be omitted.

In the method for manufacturing the image pickup apparatus 1A, the inner lead 21 and the bump 14 are compression-bonded while being transformed. That is, the top face of the bump 14 before being bonded is flat and does not have a height difference.

Figure 13:
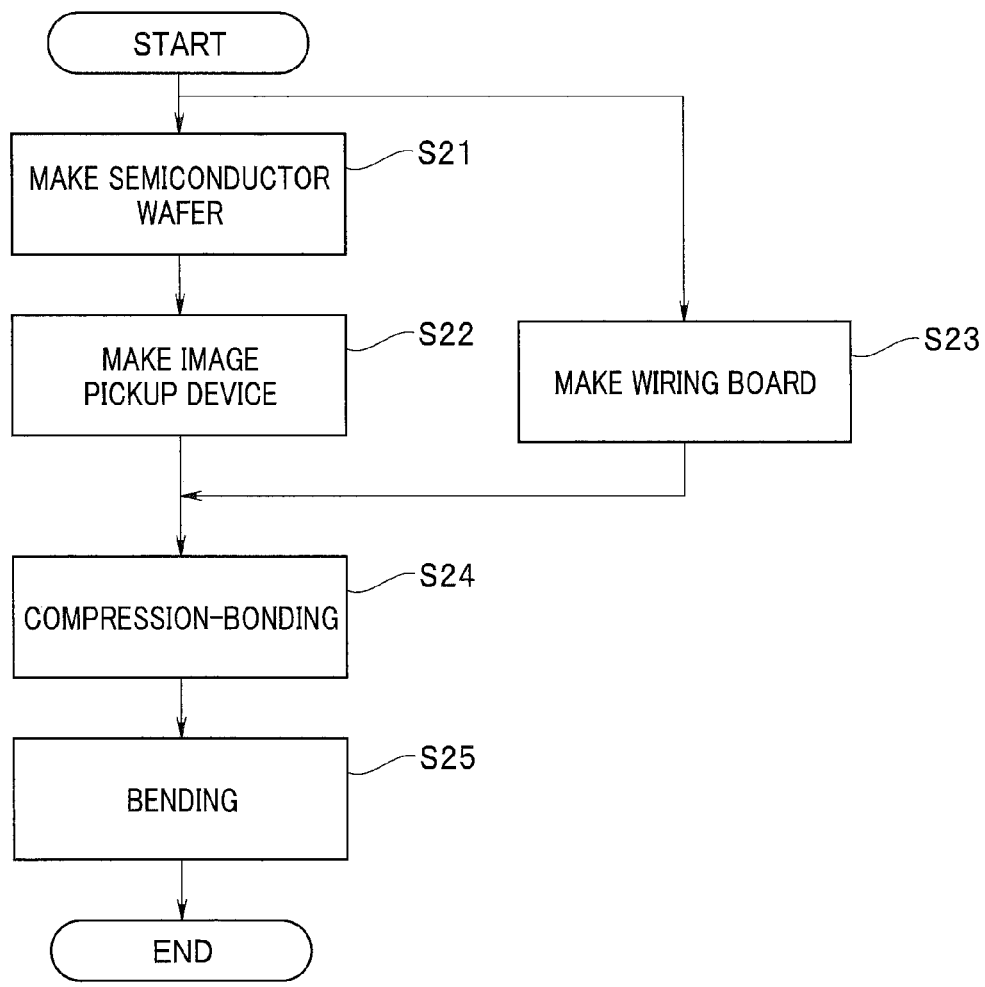
FIG. 13 is a flowchart of a method for manufacturing an image pickup apparatus of a second embodiment of the present invention.

The method for manufacturing the image pickup apparatus 1A will be described along a flowchart of FIG. 13.

<Steps S21, S22 and S23>

Steps S21, S22 and S23 are substantially same as steps S11, S12 and S14 for the image pickup apparatus 1 already described. However, the bump transformation process (step S13) in the method for manufacturing the image pickup apparatus 1 is unnecessary.

<Step S24>

Figure 14A:
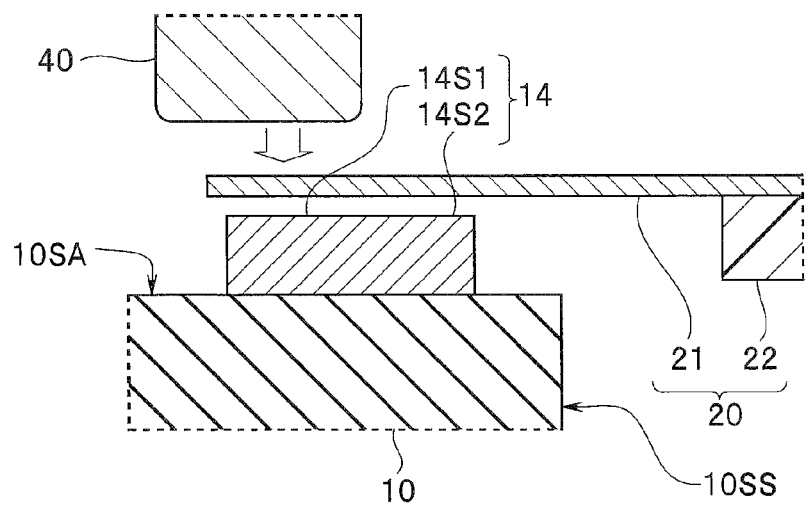
FIG. 14A is a cross-sectional view for illustrating the method for manufacturing the image pickup apparatus of the second embodiment of the present invention.

In a compression-bonding process for the image pickup apparatus 1A, the compression-bonding jig 40 presses the light receiving portion side 14S1 of the bump 14 of the image pickup device 10, and the side face side 14S2 is set at a position of not being pressed, as shown in FIG. 14A.

Figure 14B:
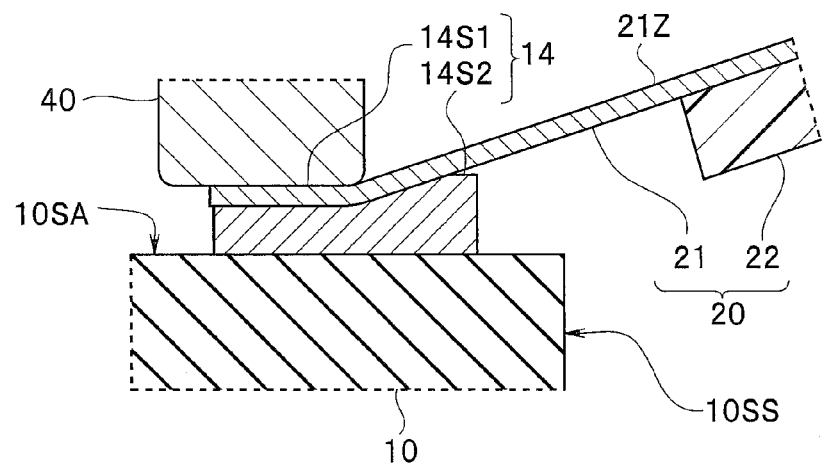
FIG. 14B is a cross-sectional view for illustrating the method for manufacturing the image pickup apparatus of the second embodiment of the present invention.

Therefore, as shown in FIG. 14B, the inner lead 21 and the bump 14 are simultaneously compression-bonded while being plastically transformed by pressing force of the compression-bonding jig 40.

That is, a height of the light receiving portion side 14S1 of the bump 14 is lower than a height of the side face side 14S2. On the other hand, the inner lead 21 is plastically transformed in a recess shape relative to the light receiving surface 10SA with an end face bonded to the light receiving portion side 14S1 of the bump 14 as a starting point. Therefore, similarly to the case of being bonded to a bump having a height difference on the top face in advance (the first embodiment, FIG. 8B and the like), the rear end portion 21Z of the inner lead 21 is away from the light receiving surface 10SA. Note that, though interfaces of the bump 14 and the inner lead 21 which are not pressed by the compression-bonding jig 40 are in contact with each other, they are not bonded strongly.

<Step S25>

Figure 14C:
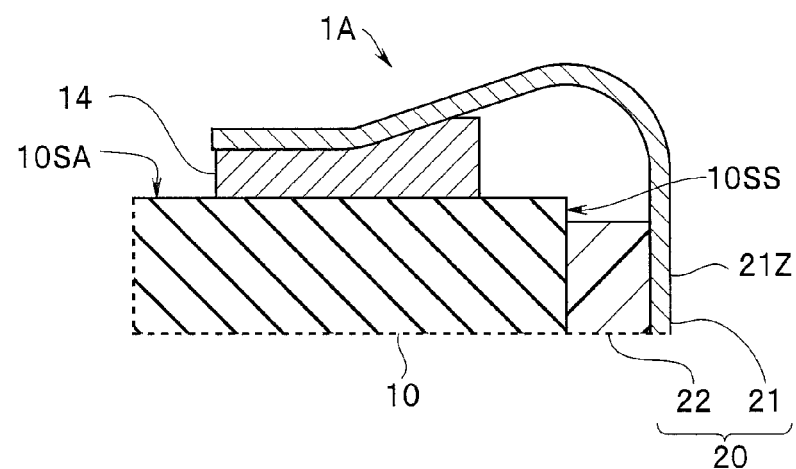
FIG. 14C is a cross-sectional view for illustrating the method for manufacturing the image pickup apparatus of the second embodiment of the present invention.

As shown in FIG. 14C, the inner lead 21 is bent so that the rear end portion 21Z is arranged substantially parallel to the side face 10SS of the image pickup device 10.

The method for manufacturing the image pickup apparatus 1A has the same advantageous effect as the method for manufacturing the image pickup apparatus 1. Furthermore, since it is not necessary to form a bump 14 having a step on the top face before bonding, manufacture is easy.

<Modification of the Second Embodiment>

The method for compression-bonding the inner lead 21 and the bump 14 while the inner lead 21 and the bump 14 are being plastically transformed at the same time is not limited to the method using the compression-bonding jig 40 having a flat compression-bonding surface.

Figure 15:
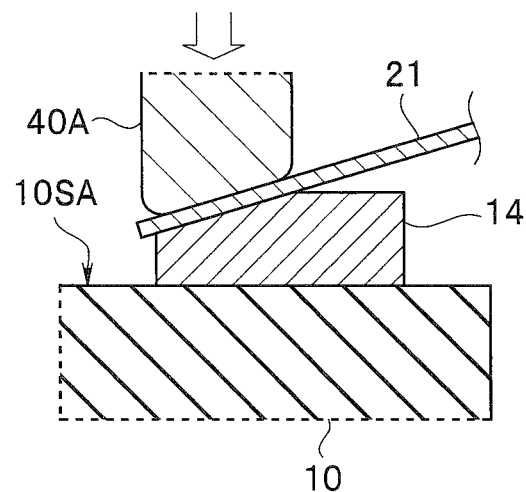
FIG. 15 is a cross-sectional view for illustrating a method for manufacturing the image pickup apparatus, of a modification of the second embodiment of the present invention.

A compression-bonding surface of a compression-bonding jig 40A shown in FIG. 15 is inclined. Therefore, the top face of the bump 14 is bonded to the inner lead 21 while being plastically transformed into a slope surface relative to the light receiving surface 10SA.

Figure 16:
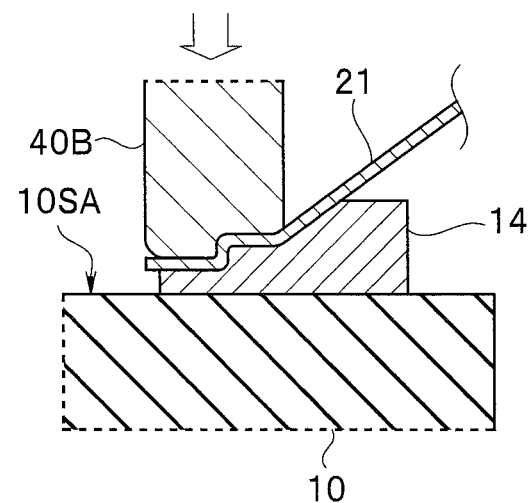
FIG. 16 is a cross-sectional view for illustrating a method for manufacturing the image pickup apparatus, of a modification of the second embodiment of the present invention.

A compression-bonding jig 40B shown in FIG. 16 has a step on a compression-bonding surface. Therefore, the bump 14 is bonded to the inner lead 21 while the top face being plastically transformed into a surface having a step.

Figure 17:
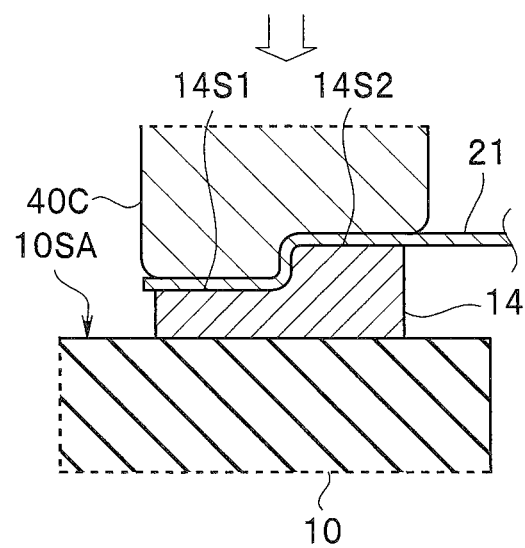
FIG. 17 is a cross-sectional view for illustrating a method for manufacturing the image pickup apparatus, of a modification of the second embodiment of the present invention.

A compression-bonding jig 40C shown in FIG. 17 has a step on a compression-bonding surface. The whole top face of the bump 14 is pressed, and the bump 14 is bonded to the inner lead 21 while being plastically transformed.

Figure 18:
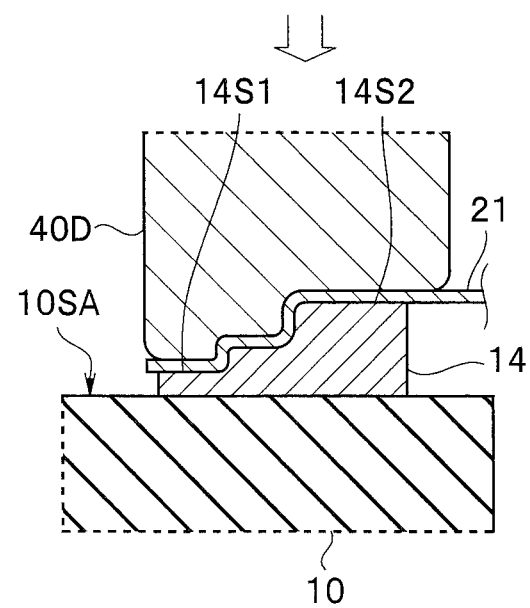
FIG. 18 is a cross-sectional view for illustrating a method for manufacturing the image pickup apparatus, of a modification of the second embodiment of the present invention.

A compression-bonding jig 40D shown in FIG. 18 has two steps on a compression-bonding surface. The whole top face of the bump 14 is pressed, and the bump 14 is bonded to the inner lead 21 while being plastically transformed.

As for the inner leads 21 shown in FIGS. 17 and 18, since the side face side 14S2 of the top face of the bump 14 is higher than the light receiving surface side 14S1, space between the inner lead 21 and the light receiving surface 10SA is large.

All of the manufacturing methods of the modifications using the various kinds of the compression-bonding jigs 40A to 40C and the image pickup apparatuses manufactured by the manufacturing methods of the modifications have advantageous effects similar to those of the manufacturing method and image pickup apparatus of the second embodiment.

The present invention is not limited to the embodiments described above, and various changes, alterations and the like can be made within a range not departing from the spirit of the present invention.

What is claimed is:

1. An image pickup apparatus comprising:
    an image pickup device on which a plurality of bumps connected to a light receiving portion are arranged in line on an outer circumferential portion of a light receiving surface on which the light receiving portion is formed; and
    a flexible wiring board comprising a plurality of inner leads, each of the plurality of leads being configured with a distal end portion, a bending portion and a rear end portion, the distal end portion being compression-bonded to any one of the plurality of bumps, and the rear end portion being arranged parallel to an end surface of the image pickup device with the bending portion interposed between the distal end portion and the rear end portion, the plurality of inner leads extending from an end surface of the flexible wiring board such that the end surface of the flexible wiring board is parallel with the light receiving surface of the image pickup device; wherein
    a height of a light receiving portion side of the bumps is lower than a height of a side face side;
    the bending portion of each of the inner leads is plastically transformed according to a shape of top faces of the bumps; and
    the bending portion comprises a first bending portion bent in an upward direction so as to be away from the light receiving surface of the image pickup device, with a bonded portion between the distal end portion and the bump as a starting point, and a second bending portion bent so that the rear end portion is parallel to the end surface of the image pickup device.

2. The image pickup apparatus according to claim 1, wherein there is a step on the top faces of the bumps.

3. The image pickup apparatus according to claim 1, wherein the top faces of the bumps are inclined relative to the light receiving surface.

4. The image pickup apparatus according to claim 1, wherein each of the bumps is configured with a plurality of members with different heights.

5. The image pickup apparatus according to claim 1, wherein the light receiving portion side of the bumps is plastically transformed by external pressure.

6. The image pickup apparatus according to claim 5, wherein the light receiving portion side of the bumps is plastically transformed before being bonded to one of the inner leads.

7. The image pickup apparatus according to claim 5, wherein a distal end side of the inner leads and the light receiving portion side of the bumps are plastically transformed at a time of being bonded.

8. The image pickup apparatus according to claim 1, wherein at least a portion of a side surface of the flexible wiring board contacts the end surface of the image pickup device, the side surface of the flexible wiring board having a greater area that the end surface of the image pickup device.

9. An image pickup apparatus manufacturing method comprising the steps of:
- an image pickup device on which a plurality of bumps connected to a light receiving portion are arranged in line on an outer circumferential portion of a light receiving surface on which the light receiving portion is formed being made;
- pressure being applied to a light receiving portion side of the bumps so that the bumps are plastically transformed in a manner that a height of the light receiving portion side is lower than a height of a side face side;
- a flexible wiring board including a plurality of inner leads being made;
- the plurality of inner leads being compression-bonded to the bumps while being plastically transformed according to a shape of a top face of the bumps, by applying pressure to a distal end portion of each of the plurality of inner leads arranged on the light receiving portion side of the bumps to form a first bending portion in each of the plurality of inner leads, to be bent in an upward direction so as to be away from the light receiving surface of the image pickup device, with a bonded portion between the distal end portion and the bump as a starting point; and
- the plurality of inner leads being bent to form a second bending portion in each of the plurality of inner leads so that rear end portion is arranged parallel to and end surface of the image pickup device, the plurality of inner leads being formed to extend from an end surface of the flexible wiring board such that the end surface of the flexible wiring board is parallel with the light receiving surface of the image pickup device.

10. The image pickup apparatus manufacturing method according to claim 9, wherein a jig configured to apply pressure to the bumps to plastically transform the bumps is a compression-bonding jig configured to compression-bond the inner leads and the bumps.

11. The image pickup apparatus manufacturing method according to claim 10, wherein the plurality of bumps are simultaneously bonded by the compression-bonding jig in a bar shape.

12. The image pickup apparatus manufacturing method according to claim 9, wherein at least a portion of a side surface of the flexible wiring board contacts the end surface of the image pickup device, the side surface of the flexible wiring board having a greater area that the end surface of the image pickup device.

13. An image pickup apparatus manufacturing method comprising the steps of:
- an image pickup device on which a plurality of bumps connected to a light receiving portion are arranged in line on an outer circumferential portion of a light receiving surface on which the light receiving portion is formed being made;
- a flexible wiring board including a plurality of inner leads being made;
- the plurality of inner leads and the bumps being compression-bonded while being transformed, by pressure being applied to a distal end portion arranged on a light receiving portion side of the bumps to form a first bending portion in each of the plurality of inner leads, to be bent in an upward direction so as to be away from the light receiving surface of the image pickup device, with a bonded portion between the distal end portion and the bump as a starting point, the plurality of inner leads being formed to extend from an end surface of the flexible wiring board such that the end surface of the flexible wiring board is parallel with the light receiving surface of the image pickup device; and
- the plurality of inner leads being bent so that rear end portions are arranged parallel to an end surface of the image pickup device.

14. The image pickup apparatus manufacturing method according to claim 13, wherein the plurality of bumps are simultaneously bonded by a compression-bonding jig in a bar shape.

15. The image pickup apparatus manufacturing method according to claim 13, wherein at least a portion of a side surface of the flexible wiring board contacts the end surface of the image pickup device, the side surface of the flexible wiring board having a greater area that the end surface of the image pickup device.

* * * * *